(12) United States Patent
Seike

(10) Patent No.: US 10,028,396 B2
(45) Date of Patent: Jul. 17, 2018

(54) RECYCLABLE THERMOPLASTIC PACKAGING

(71) Applicant: Empire Technology Development LLC, Wilmington, DE (US)

(72) Inventor: Aya Seike, Tokyo (JP)

(73) Assignee: EMPIRE TECHNOLOGY DEVELOPMENT LLC, Wilmington, DE (US)

(*) Notice: Subject to any disclaimer, the term of this patent is extended or adjusted under 35 U.S.C. 154(b) by 732 days.

(21) Appl. No.: 14/562,533

(22) Filed: Dec. 5, 2014

(65) Prior Publication Data
US 2015/0093528 A1 Apr. 2, 2015

Related U.S. Application Data

(62) Division of application No. 13/143,173, filed as application No. PCT/US2011/025038 on Feb. 16, 2011, now Pat. No. 8,932,502.

(51) Int. Cl.
| H05K 5/02 | (2006.01) |
| B29C 45/16 | (2006.01) |
| B05D 3/02 | (2006.01) |
| B29C 45/14 | (2006.01) |

(52) U.S. Cl.
CPC ............ *H05K 5/02* (2013.01); *B05D 3/0254* (2013.01); *B29C 45/1657* (2013.01); *H05K 5/0221* (2013.01); *B29C 2045/14327* (2013.01); *Y10T 428/1352* (2015.01); *Y10T 428/1386* (2015.01)

(58) Field of Classification Search
CPC .... H05K 5/02; H05K 5/0221; B29C 45/1657; B29C 2045/14327; B05D 3/0254; Y10T 428/1352; Y10T 428/1386
See application file for complete search history.

(56) References Cited

U.S. PATENT DOCUMENTS

| 4,362,684 A | 12/1982 | Thalmann |
| 5,904,019 A | 5/1999 | Kooij et al. |
| 7,326,044 B2 | 2/2008 | Kirchner |
| 7,699,248 B2 | 4/2010 | Moriwaki et al. |
| 2006/0105663 A1 | 5/2006 | Greulich et al. |
| 2006/0263554 A1 | 11/2006 | Yamada et al. |
| 2009/0304928 A1 | 12/2009 | Isano et al. |

FOREIGN PATENT DOCUMENTS

| JP | H07-504366 T | 5/1995 |
| JP | 2007-110138 A | 4/2007 |
| JP | 2007-301955 A | 11/2007 |
| JP | 2008-515666 T | 5/2008 |
| JP | 2008-176206 A | 7/2008 |

OTHER PUBLICATIONS

Final Office Action in U.S. Appl. No. 13/143,173 dated Dec. 3, 2013 (10 pages).

(Continued)

*Primary Examiner* — Michael C Miggins

(57) ABSTRACT

Methods and apparatuses disclosed herein relate to a recyclable thermoplastic unit that includes a casing body composed of a first thermoplastic having a first melting point. The casing body also includes a first locking mechanism that is configured to mate with a second locking mechanism of a sacrifice layer. The sacrifice layer is composed of a second thermoplastic and includes the second locking mechanism. The sacrifice layer has a melting point that is greater than the melting point of the casing body.

10 Claims, 5 Drawing Sheets

(56) References Cited

OTHER PUBLICATIONS

International Search Report and Written Opinion for PCT/US2011/025038, dated Apr. 14, 2011.
Maier, Clive and Calafut, Teresa, "Polypropylene: The Definitive User's Guide and Databook," Sep. 1, 1998, p. 14 William Andrew, Incorporated. New York New York.
Non-Final Office Action in U.S. Appl. No. 13/143,173 dated Jun. 6, 2013 (10 pages).
Non-Final Office Action in U.S. Appl. No. 13/143,173 dated Mar. 7, 2014 (12 pages).
Notice of Allowance in U.S. Appl. No. 13/143,173 dated Sep. 10, 2014 (9 pages).
STRIPCO, "Sodablasting History & Soda Blasting Process," printed on Jun. 20, 2010, http://www.sodablasting.com/about-sodablasting/, 2 pages.
"Plastic," http://en.wikipedia.org/wiki/Plastic, Jun. 30, 2011, 12 pages.
"Plastic Properties of Acrylonitrile Butadiene Styrene (ABS)," Technical Information, Dynalab Corp., Rochester, New York http://www.dynalabcorp.com/technical_info_abs.asp, Jun. 2, 2010.
"Polyethylene," http://en.wikipedia.org/wiki/Polyethylene, Jun. 2, 2010.
"Polybutylene terephthalate," Encyclopedia Britannica eb.com, http://www.britannica.com/EBchecked/topic/468341/polybutylene terephthalate, Jun. 2, 2010.
"Nylon," http://en.wikipedia.org/wiki/Polyethylene, Jun. 2, 2010.
Wilkes, Charles E. et al., "PVC Handbook," 2005, p. 414, Hanser Verlag, München, Germany.
"Nylon," Accessed at http://web.archive.org/web/20110211051507/http://en.wikipedia.org/wiki/Nylon, last modified on Feb. 5, 2011, 4 pages.
"Resin," Accessed at http://web.archive.org/web/20100602140435/http://en.wikipedia.org/wiki/Synthetic_resin#Synthetic_resins, last modified on May 28, 2010, 3 pages.

1

RECYCLABLE THERMOPLASTIC PACKAGING

CROSS-REFERENCE TO RELATED PATENT APPLICATIONS

The present Application is a divisional under 35 U.S.C. § 121 of U.S. application Ser. No. 13/143,173, filed on Jul. 1, 2011, now U.S. Pat. No. 8,932,502 which is a U.S. National Stage filing under 35 U.S.C. § 371 of International Patent Application No. PCT/US2011/025038, filed on Feb. 16, 2011, and entitled "RECYCLABLE THERMOPLASTIC PACKAGING". The disclosure of International Patent Application No. PCT/US2011/025038 and U.S. application Ser. No. 13/143,173 are incorporated herein by reference in their entirety.

BACKGROUND

The following description is provided to assist the understanding of the reader. None of the information provided or references cited is admitted to be prior art.

Casings for electronic products such as personal computers, mobile phones, and game machines are typically made from thermoplastics. Thermoplastic resin can be melted by heating the resin to its glass-transition temperature or melting point, after which it can be molded and cooled in a die to form a desired shape. Since molded thermoplastic resin can be melted again by reheating, the thermoplastic resin is recyclable. However, thermoplastics used for electronic products are usually coated with primers that provide a high degree of adhesion between the thermoplastic casing products and the electronic product's coatings. These primers and coatings are not easily removable from the thermoplastic casing. The primers and coatings are not recyclable, and this has prevented some thermoplastic materials from being recycled.

SUMMARY

An illustrative process includes molding a casing body using a molding apparatus, the casing body being a first thermoplastic with a first melting point and including a first locking mechanism. The process further includes molding a sacrifice layer with a second thermoplastic having a second melting point and a second locking mechanism that is configured to mate with the first locking mechanism. The second melting point is higher than the first melting point. The process further includes locking the molded sacrifice layer onto the casing body by mating the first locking mechanism with the second locking mechanism.

An illustrative article of manufacture includes a sacrifice layer composed of a thermoplastic. The sacrifice layer includes a first locking mechanism configured to mate with a second locking mechanism of a casing body. The thermoplastic has a melting point that is greater than the melting point of the casing body.

An illustrative apparatus includes a casing body composed of a first thermoplastic having a first melting point. The casing body includes a first locking mechanism. The illustrative apparatus also has a sacrifice layer composed of a second thermoplastic having a second melting point. The sacrifice layer includes a second locking mechanism that is configured to mate with the first locking mechanism. Further, the second melting point is greater than the first melting point.

Another illustrative apparatus includes a means for molding a casing body with a first thermoplastic having a first melting point. The casing body includes a first locking mechanism. The apparatus further has a means for molding a sacrifice layer with a second thermoplastic having a second melting point. The molded sacrifice layer includes a second locking mechanism that is configured to mate with the first locking mechanism. The second melting point is greater than the first melting point. The apparatus further including a means for locking the molded sacrifice layer onto the casing body by mating the first locking mechanism with the second locking mechanism.

In another illustrative process, a method includes molding a sacrifice layer composed of a thermoplastic. The sacrifice layer includes a first locking mechanism configured to mate with a second locking mechanism of a casing body. The thermoplastic has a melting point that is greater than the melting point of the casing body.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

Figure 1:
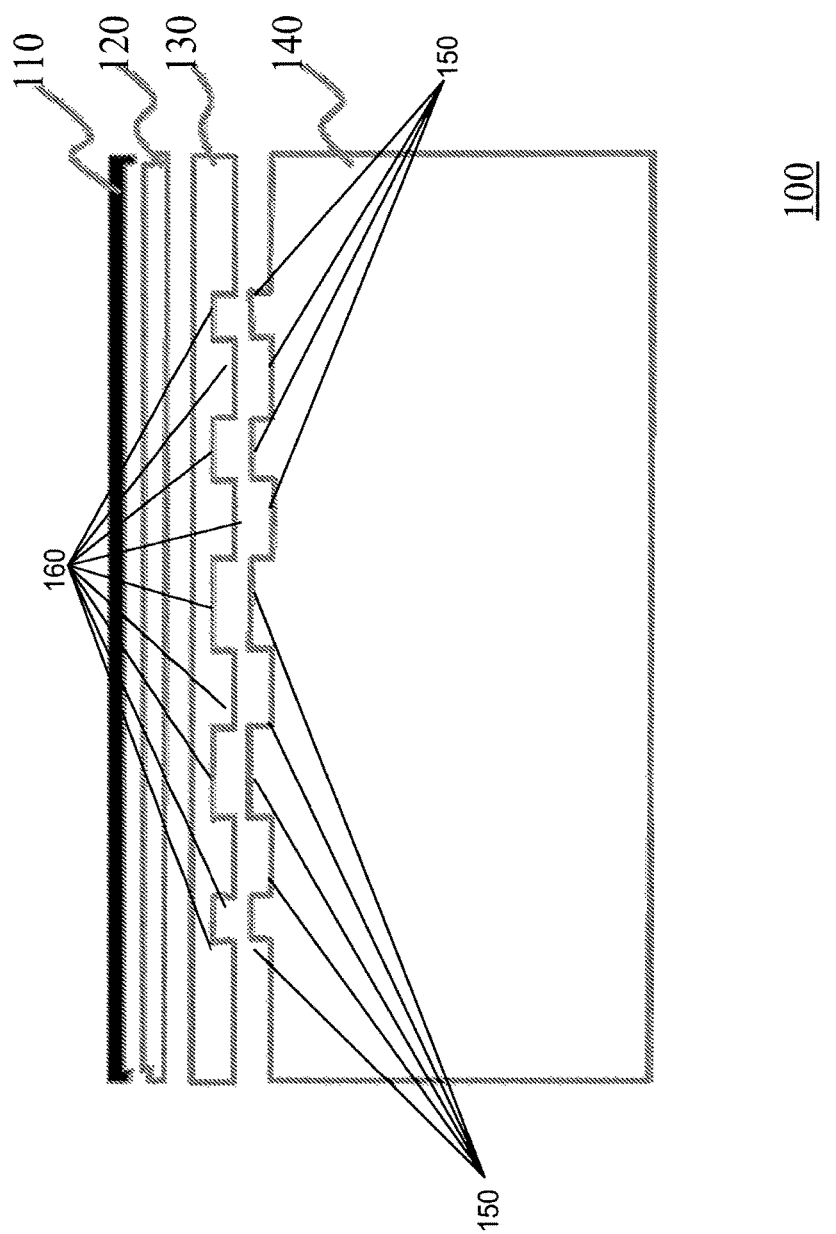
FIG. 1 is a cross-section view of an illustrative embodiment of a recyclable thermoplastic unit.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

FIG. 1 is a cross-section view of an illustrative embodiment of a recyclable thermoplastic unit 100. The recyclable thermoplastic unit 100 can be used to encase electronic components, to form packaging for goods, to form a storage container, to form a trash or recycling bin, and/or for any other product which can be formed from a thermoplastic. In an illustrative embodiment, recyclable thermoplastic unit 100 can be used to encase personal computers, mobile phones and personal digital assistants, gaming machines or devices, televisions, landline telephones, vehicles (car, tracks, loading shovels, roller coasters, boats, etc), food trays, televisions, displays, telephones, FAX machines, air conditioner, refrigerators, etc.

The recyclable thermoplastic unit 100 includes a casing body 140. In an illustrative embodiment, the casing body 140 can be formed from one or more thermoplastics. Thermoplastics that may be used in the casing body 140 can include, but are not limited to, polyethylene (PE), polypropylene (PP), polyvinyl chloride (PVC), and acrylonitrile butadiene styrene (ABS), acrylonitrile styrene acrylic ester copolymer (ASA), polyamide (PA), polybutylene terephthalate (PBT), polymethyl methacrylate (PMMA), polycarbonate (PC), polyacetals (POM), polyphenylene ether (PPE), unsaturated polyester resins (UP), polyurethane (PUR), cyclic olefin copolymer (COC), ethylene-vinyl acetate (EVA), ethylene vinyl alcohol (EVOH), liquid crystal polymer (LCP), polyacrylates (Acrylic), polyacrylonitrile (PAN), polyamide-imide (PAI), polyaryletherketone (PAEK), polybutadiene (PBD), polybutylene (PB), polycaprolactone (PCL), polychlorotrifluoroethylene (PCTFE), polyethylene terephthalate (PET), polycyclohexylene dimethylene terephthalate (PCT), polyhydroxyalkanoates (PHAs), polyketone (PK), polyethylene (PE), polyester, polyetheretherketone (PEEK), polyetherketoneketone (PEKK), polyetherimide (PEI), polyethersulfone (PES), chlorinated polyethylene (CPE), polyimide (PI), polylactic acid (PLA), polymethylpentene (PMP), polyphenylene oxide (PPO), polyphenylene sulfide (PPS), polyphthalamide (PPA), polystyrene (PS), polysulfone (PSU), polytrimethylene terephthalate (PTT), polyurethane (PU), polyvinyl acetate (PVA), polyvinylidene chloride (PVDC), styrene-acrylonitrile (SAN), etc. The casing body 140 can be various thicknesses. For instance, the casing body 140 can be, but is not limited to, about 0.25 millimeter (mm), about 0.5 mm, about 1 mm, about 10 mm, and about 100 mm.

In an illustrative embodiment, the casing body 140 can be formed using a molding apparatus. The molding apparatus can heat a thermoplastic to at least its melting point (or glass-transition temperature) and pour the melted thermoplastic into a die of a desired shape. The desired shape of the casing body 140 can depend on the intended use of the recyclable thermoplastic unit 100. The processes and tools for molding a thermoplastic are well known to those of skill in the art and are not described in detail herein.

The recyclable thermoplastic unit 100 also includes a sacrifice layer 130. In an illustrative embodiment, the sacrifice layer 130 can be composed of one or more thermoplastic that has a higher melting point than the melting point of the casing body 140. The sacrifice layer 130 can be composed of polyamide, polybutylene, or any other thermoplastic having a higher melting point than that of the casing body 140. The sacrifice layer 130 can be made of, but is not limited to, any thermoplastic such as polyethylene (PE), polypropylene (PP), polyvinyl chloride (PVC), acrylonitrile butadiene styrene (ABS), acrylonitrile styrene acrylic ester copolymer (ASA), polyamide (PA), polybutylene terephthalate (PBT), polymethyl methacrylate (PMMA), polycarbonate (PC), polyacetals (POM), polyphenylene ether (PPE), unsaturated polyester resins (UP), polyurethane (PUR), cyclic olefin copolymer (COC), ethylene-vinyl acetate (EVA), ethylene vinyl alcohol (EVOH), liquid crystal polymer (LCP), polyacrylates (Acrylic), polyacrylonitrile (PAN), polyamide-imide (PAI), polyaryletherketone (PAEK), polybutadiene (PBD), polybutylene (PB), polycaprolactone (PCL), polychlorotrifluoroethylene (PCTFE), polyethylene terephthalate (PET), polycyclohexylene dimethylene terephthalate (PCT), polyhydroxyalkanoates (PHAs), polyketone (PK), polyethylene (PE), polyester, polyetheretherketone (PEEK), polyetherketoneketone (PEKK), polyetherimide (PEI), polyethersulfone (PES), chlorinated polyethylene (CPE), polyimide (PI), polylactic acid (PLA), polymethylpentene (PMP), polyphenylene oxide (PPO), polyphenylene sulfide (PPS), polyphthalamide (PPA), polystyrene (PS), polysulfone (PSU), polytrimethylene terephthalate (PTT), polyurethane (PU), polyvinyl acetate (PVA), polyvinyl chloride (PVC), polyvinylidene chloride (PVDC), styrene-acrylonitrile (SAN), and etc. The sacrifice layer 130 can be various thicknesses. For instance, the sacrifice layer 130 can be, but is not limited to, about 0.1 millimeter (mm), about 0.25 mm, about 0.5 mm, about 1 mm, about 10 mm, and about 100 mm. The molding process used to form the sacrifice layer 130 can be similar to the molding process used to form the casing body 140. In an alternative embodiment, the molding process used to form the sacrifice layer 130 can be different from the molding process used to form the casing body 140. As discussed in more detail below, in another alternative embodiment, the sacrifice layer 130 may not have a melting point higher than that of the casing body 140. In such an embodiment, the melting point of the sacrifice layer 130 may be the same as or less than the melting point of the casing body 140.

As illustrated in FIG. 1, the casing body 140 includes a locking mechanism that includes a series of grooves and protrusions 150. The sacrifice layer 130 similarly includes a locking mechanism that includes a series of grooves and protrusions 160 that are configured to mate with the series of grooves and protrusions 150 of the casing body 140. In one embodiment, the series of grooves and protrusions 150 can snap into the series of grooves and protrusions 160 to interlock the sacrifice layer 130 to the casing body 140. The snapping of the series of grooves and protrusions 150 into the series of grooves and protrusions 160 can form a friction fit so that the sacrifice layer 130 is anchored to the casing body 140. To accomplish this, in one illustrative embodiment the sacrifice layer 130 includes grooves that interlock or mate with corresponding grooves in the casing body 140 to anchor the sacrifice layer 130 to the casing body 140.

Figure 5:
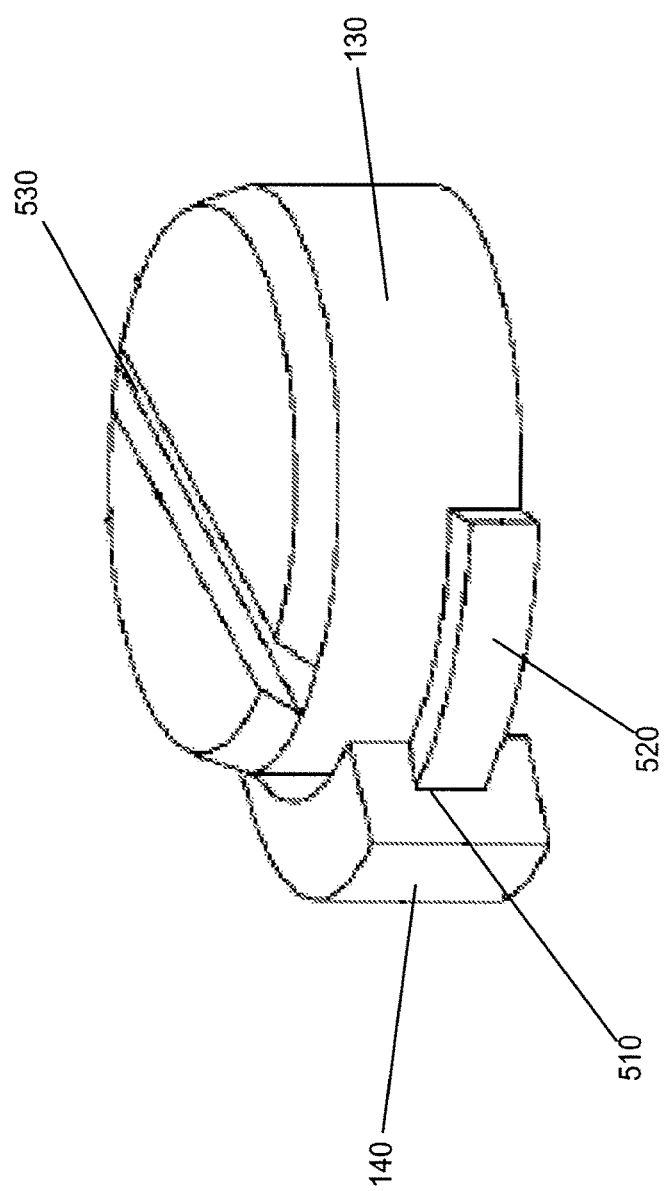
FIG. 5 is a focused-section view of a recyclable thermoplastic unit in accordance with an illustrative embodiment.

In one embodiment, to provide even stronger anchoring between the sacrifice layer 130 and the casing body 140, the sacrifice layer 130 may be rotated by some angle relative to the casing body 140. Alternatively, the casing body 140 may be rotated by some angle relative to the sacrifice layer 130. FIG. 5 illustrates a focused section of a casing body 140 that includes a slot 510. The sacrifice layer 130 includes a protrusion 520 that fits within the slot 510 of the casing body 140. The casing body 140 may be rotated such that the slot 510 and the protrusion interlock. In an illustrative embodiment, the angle of rotation between the sacrifice layer 130 and the casing body 140 can be 90 degrees. In alternative embodiments, the angle of rotation may be 30 degrees, 45 degrees, 60 degrees, 120 degrees, 180 degrees, or any other angle. In another embodiment, the sacrifice layer 130 can include a groove 530 for use in rotating the sacrifice layer 130 relative to the casing body 140. Other non-limiting examples include the casing body 140 having a groove or both the casing body 140 and the sacrifice layer 130 having grooves for use in rotating the casing body 140 and the sacrifice layer 130 relative to one another.

In an alternative embodiment, the series of grooves and protrusions 150 and the series of grooves and protrusions 160 may have a different shape and/or configuration than that illustrated in FIG. 1. In one embodiment, the casing body 140 (or the sacrifice layer 130) may include a series of cylindrical posts that are configured to mate with a series of cylindrical holes in the sacrifice layer 130 (or the casing body 140). In an alternative embodiment, the series of posts and holes may be square, triangular, rectangular, or any other shape. In another alternative embodiment, the posts and the holes can be placed along the perimeter of the sacrifice layer 130 and the casing body 140.

The recyclable thermoplastic unit 100 also includes a primer layer 120. In an illustrative embodiment, the primer layer 120 can be applied directly to the sacrifice layer 130. The primer layer 120 is a highly adhesive coating that can be difficult to remove from the sacrifice layer 130. The primer layer 120 provides a high degree of adhesion between a coating layer 110 and the sacrifice layer 130. The primer layer 120 can be applied by any method known to those of skill in the art, such as, but not limited to spray painting, roller painting, brush painting, or dipping painting. Various primer can be used such as those made of, but not limited to, urethane, urea formaldehyde resin, urethane prepolymer, polyurethane, epoxy resin, ketone, ketimine compounds with ketimine (C=N) bond, polyol, polyisocyanate, polyolefin, urethane resin, acyl resin, diol with carboxyl group and mixtures of the above chemicals. The processes, materials, and tools for applying a primer layer onto a thermoplastic are well known to those of skill in the art.

In one embodiment, the primer layer 120 can be used for adjusting a thickness of the recyclable thermoplastic body 100. The primer layer 120 can be increased in thickness, resulting in a thicker thermoplastic body 100. The thickness of the primer lay 120 can also be decreased, resulting in a thinner thermoplastic body 100.

In one embodiment the sacrifice layer 130 and the primer layer 120 have similar chemical properties, such as melting points. The adhesiveness between the sacrifice and primer layer is enhanced by using a primer layer 120 that has similar chemical properties to the sacrifice layer 130.

In an illustrative embodiment, the primer layer 120 can be applied to the sacrifice layer 130 only. As such, the sacrifice layer 130 can be between the primer layer 120 and the casing body 140, and the casing body 140 does not contact any portion of the primer layer 120.

The recyclable thermoplastic unit 100 also includes a coating layer 110. The coating layer 110 can have various properties based upon the use of the recyclable casing 100, such as, but not limited to, antifouling, resistance to solvents, stiffness, water-resistance, and humidity resistance. Various chemicals can be used for the coating layer 110 such as, but not limited to, polyurethane, vinyl polymer, vinyl polymer with carbonyl group, diisocyanate, polycarbonate diol, diol with carboxylic group, polyurethane prepolymer, and mixtures of the above chemicals. In one embodiment, the coating layer 110 has an antifouling property by including an antifouling agent, such as, but not limited to, a petroleum solvent, silicone oil, surfactant, silicone oligomer, fluorine, and mixtures of above chemicals. The coating layer 110 may also include pigments, leveling agents, ultraviolet absorbers, and/or conductive material additives as long as the chemical properties of the coating layer are not affected. Similar to the sacrifice layer 130, the coating layer 110 can be substantially thinner than the casing body 140.

In an illustrative embodiment, the coating layer 110 can be applied to the primer layer 120, and the primer layer 120 can adhere the coating layer 110 to the recyclable thermoplastic unit 100. The coating layer 110 allows various graphics, text, and other indicia to be displayed on the recyclable thermoplastic unit 100. The relatively high adhesion between the coating layer 110 and the primer layer 120 can make the graphics, text, and other indicia difficult to remove from the sacrifice layer 130. The processes, materials, and tools for applying a coating layer onto a primer layer are well known to those of skill in the art and are not described in detail herein.

In an illustrative embodiment, the casing body 140 is only in contact with the sacrifice layer 130 so that the casing body 140 remains separated from the primer layer 120 and the coating layer 110. As such, the casing body 140 can be detached from the sacrifice layer 130, the primer layer 120, and the coating layer 110 by detaching the casing body 140 from the sacrifice layer 130. Once detached, the casing body 140 can be recycled in accordance with any recycling method known to those of skill in the art. In one embodiment, the casing body 140 can be detached from the sacrifice layer 130 by unsnapping or otherwise removing the series of grooves and protrusions 150 of the casing body 140 from the series of grooves and protrusions 160 of the sacrifice layer 130 so that the grooves and protrusions are no longer interlocked. If the casing body 140 was rotated by an angle to anchor the casing body 140 to the sacrifice layer 130, the casing body 140 can be rotated by the angle in the opposite direction to detach the casing body 140 from the sacrifice layer 130. Similarly, if the sacrifice layer 130 was rotated by an angle to anchor the sacrifice layer 130 to the casing body 140, the sacrifice layer 130 can be rotated by the angle in the opposite direction to detach the sacrifice layer 130 from the casing body 140. In such an embodiment where the casing body 140 can be detached from the sacrifice layer 130 by unlocking the interlocking components, the melting point of the sacrifice layer 130 may be less than, equal to, or greater than the melting point of the casing body 140.

In some embodiments, it may be extremely difficult to remove the casing body 140 from the sacrifice layer 130 once the series of grooves and protrusions 150 of the casing body 140 are interlocked with the series of grooves and protrusions 160 of the sacrifice layer 130. The difficultly can arise as a result of a tight frictional fit between the corresponding grooves and protrusions and/or as a result of any rotation between the casing body 140 and the sacrifice layer 130. In one embodiment, the casing body 140 may be melted to the sacrifice layer 130 to anchor the casing body 140 to the sacrifice layer 130. The melting can be performed after the series of grooves and protrusions 150 of the casing body 140 are interlocked with the series of grooves and protrusions 160 of the sacrifice layer 130. In an alternative embodiment, the casing body 140 and the sacrifice layer 130 may not include any grooves or protrusions, and the casing body 140 can be anchored to the sacrifice layer 130 solely by melting the casing body 140 to the sacrifice layer 130.

In embodiments where it may be difficult to simply detach the casing body 140 from the sacrifice layer 130 (e.g., where melting is involved in the anchoring process or where there is a tight frictional fit between the casing body 140 and the sacrifice layer 130), the recyclable thermoplastic unit 100 can be designed so that the casing body 140 has a lower melting point than the sacrifice layer 130. The casing body 140 can be composed of thermoplastics including, but not limited to, polyethylene, polypropylene, polyvinyl chloride, or acrylonitrile butadiene styrene. The sacrifice layer 130 can be composed of thermoplastics including, but not limited to, polyproylene or polybutylene. In one embodiment, the casing body 140 can be composed of acrylonitrile butadiene styrene, which has a melting point of 105 degrees Celsius, and the sacrifice layer 130 can be composed of polybutylene, which has a melting point of 220 degrees Celsius. In another embodiment, the casing body 140 can be composed of polyethylene, which has a melting point between 120-130 degrees Celsius, and the sacrifice layer 130 can be composed of polypropylene, which has a melting point between 160-166 degrees Celsius. Other embodiments are also possible. A sacrifice layer 130 can be made of any thermoplastic that has a higher melting point than the casing body 140.

In an embodiment where the casing body 140 has a lower melting point than the sacrifice layer 130, the casing body 140 can be detached from the sacrifice layer 130 by heating the casing body 140 to a temperature that is greater than or equal to the melting point of the casing body 140 and less than the melting point of the sacrifice layer 130. The heating may be accomplished using a heater, an oven, or any other heating device known to those of skill in the art. Once the casing body 140 is heated to or above its melting point, the casing body 140 can be allowed to melt away from the sacrifice layer 130, thereby detaching the casing body 140. Once detached, the casing body 140 may be recycled according to any recycling process known to those of skill in the art. The casing body 140 may be reused in whole, melted and remolded, melted and combined with another material, etc.

The primer layer 120 and the coating layer 110 are typically not recyclable. The sacrifice layer 130, therefore, is also typically not recyclable as the primer layer 120 and the coating layer 110 remain attached to the sacrifice layer 130 after the casing body 140 has been removed. Accordingly, the sacrifice layer 130 can be substantially thinner than the casing body 140 to minimize the amount of thermoplastic waste. For instance, the sacrifice layer 130 can be, but is not limited to, about 0.1 millimeter (mm), about 0.25 mm, about 0.5 mm, about 1 mm, about 10 mm, and about 100 mm and, the casing body 140 can be, but is not limited to, about 0.25 millimeter (mm), about 0.5 mm, about 1 mm, about 10 mm, and about 100 mm.

Figure 2:
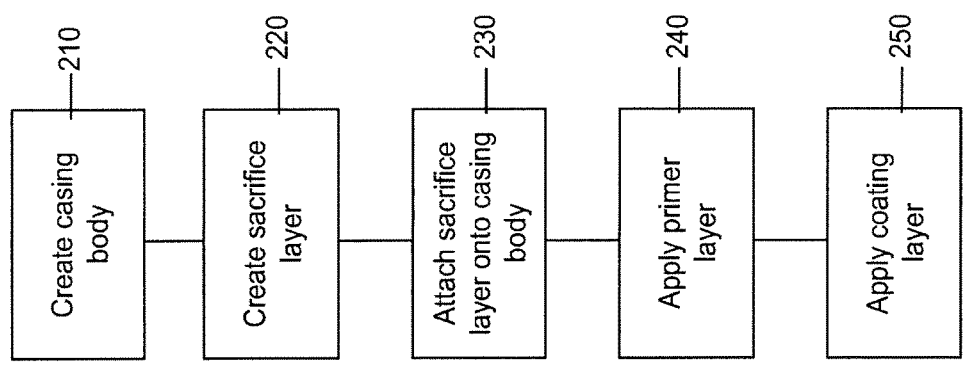
FIG. 2 is a flow diagram depicting operations performed in assembling a recyclable thermoplastic unit in accordance with an illustrative embodiment.

FIG. 2 is a flow diagram depicting operations performed in assembling the recyclable thermoplastic unit 100 in accordance with an illustrative embodiment. Additional, fewer, and/or different operations may be performed depending on the particular implementation. In an operation 210, the casing body 140 is created. The casing body 140 can be created by molding a thermoplastic into a desired shape. The desired shape of the casing body 140 can depend on the intended use of the recyclable thermoplastic unit 100. In an operation 220, a sacrifice layer 130 is created. The sacrifice layer 130 can be created in a similar manner as the casing body 140. The processes and tools for molding a thermoplastic are well known to those of skill in the art and are not described in detail herein.

In an operation 230, the sacrifice layer 130 is attached to the casing body 140 through various locking mechanisms. Locking mechanisms may include, but are not limited to, a corresponding series of grooves and protrusions, or posts and corresponding holes. If stronger adhesions between the sacrifice layer 130 and the casing body 140 is needed, the sacrifice layer 130 may be rotated by some angle relative to the casing body 140 after the series of grooves and protrusions 150 are interlocked with the series of grooves and protrusions 160. Alternatively, the casing body 140 may be rotated by some angle relative to the sacrifice layer 130. In an illustrative embodiment, the angle of rotation between the sacrifice layer 130 and the casing body 140 can be 90 degrees. In alternative embodiments, the angle of rotation may be 30 degrees, 45 degrees, 60 degrees, 120 degrees, 180 degrees, or any other angle. In an alternative embodiment, the casing body 140 can be attached to the sacrifice layer 130 by melting the casing body 140 onto the sacrifice layer 130. The casing body 140 may be melted onto the sacrifice layer 130 regardless of whether any locking mechanism and/or rotation are used to secure the sacrifice layer 130 to the casing body 140.

In an operation 240, a primer layer 120 is applied to at least a portion of the sacrifice layer 130. The primer layer 120 provides a high degree of adhesion between the coating layer 110 and the sacrifice layer 130. In an operation 250, the coating layer 110 is applied to at least a portion of the primer layer 120. Text, graphics, or other indicia can be applied to the recyclable thermoplastic unit 100 via the coating layer 110.

Figure 3:
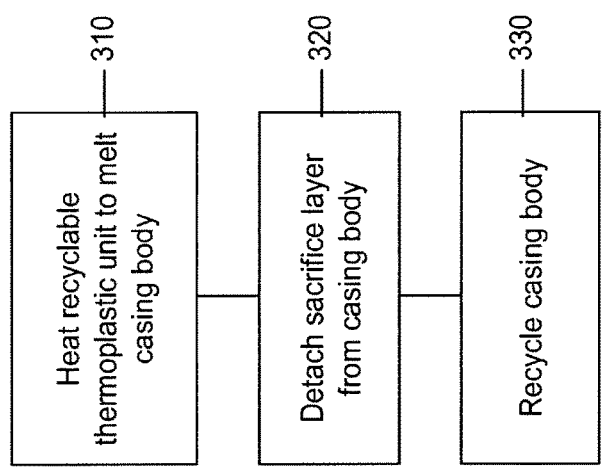
FIG. 3 is a flow diagram depicting operations performed in recycling a recyclable thermoplastic unit in accordance with an illustrative embodiment.

FIG. 3 is a flow diagram depicting operations performed in recycling a recyclable thermoplastic unit 100 in accordance with an illustrative embodiment. Additional, fewer, and/or different operations may be performed depending on the particular implementation. In an operation 310, the recyclable thermoplastic unit 100 is heated. In one embodiment, the recyclable thermoplastic unit 100 is heated to a temperature to melt the casing body 140. In another embodiment, the recyclable thermoplastic unit 100 is heated to a temperature that is above the melting point of the casing body 140, but below the melting point of the sacrifice layer 130. In an operation 320, the sacrifice layer 130 is detached from the casing body 140. The casing body 140 can be detached from the sacrifice layer 130 by melting the casing body off of the sacrifice layer 130. If the casing body 140 was rotated by an angle to anchor the casing body 140 to the sacrifice layer 130, the casing body 140 can be rotated by the angle in the opposite direction to detach the casing body 140 from the sacrifice layer 130. Similarly, if the sacrifice layer 130 was rotated by an angle to anchor the sacrifice layer 130 to the casing body 140, the sacrifice layer 130 can be rotated by the angle in the opposite direction to detach the sacrifice layer 130 from the casing body 140. In an operation 330, the casing body 140 is recycled in accordance with any recycling method known to those of skill in the art.

Figure 4:
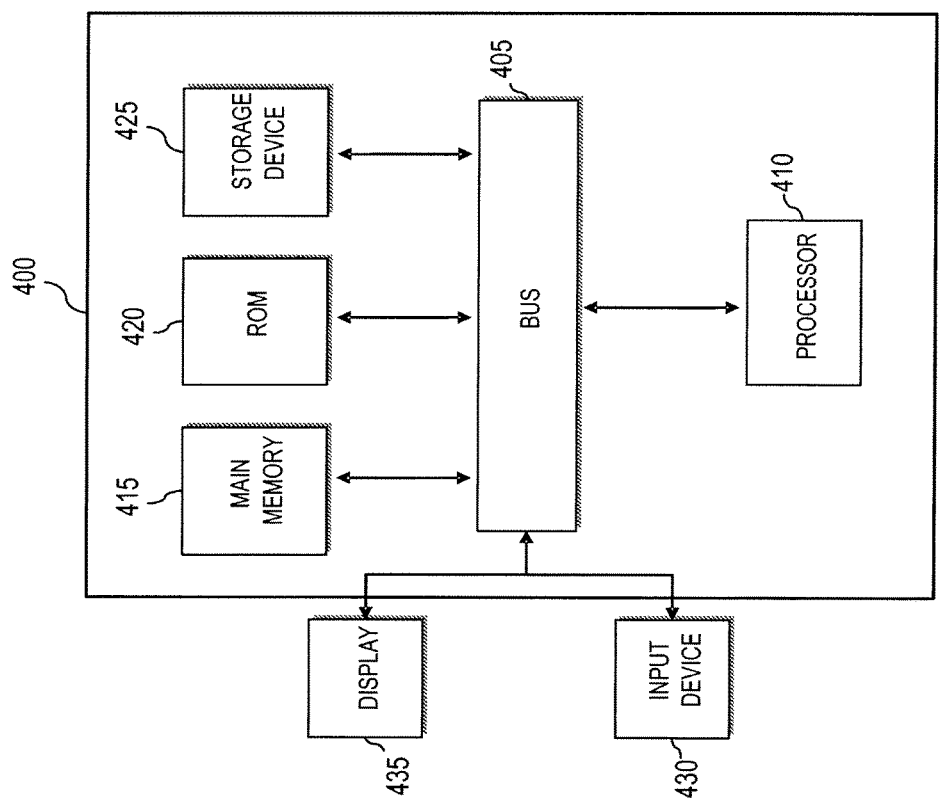
FIG. 4 depicts an illustrative computer system which can control the assembly and/or recycling operations described herein.

FIG. 4 depicts an illustrative computer system which can control the assembly and/or recycling operations described herein. The computing system 400 includes a bus 405 or other communication mechanism for communicating information and a processor 410 coupled to the bus 405 for processing information. The computing system 400 also includes main memory 415 such as a random access memory (RAM) or other dynamic storage device, a read only memory (ROM) 420, and a storage device 425 such as a solid state device, magnetic disk, or optical disk. In alternative embodiments, fewer, additional, and/or different types of memory or storage may be included in the computing system 400. The main memory 415, the ROM 420, and the storage device 425 are coupled to the bus 405 for communication with and access by the processor 410. The main memory 415, the ROM 420, and/or the storage device 425 can be configured to store information and/or computer-readable instructions that are to be executed by the processor 410. The computer-readable instructions can be used to implement any of the operations described herein with respect to assembly, disassembly, and/or recycling of the recyclable thermoplastic unit 100.

The computing system 400 may be coupled via the bus 405 to a display 435, such as a liquid crystal display, or active matrix display, for displaying information to a user. An input device 430, such as a keyboard including alphanumeric and other keys, may be coupled to the bus 405 for communicating instructions, information, and command selections to the processor 410. In another embodiment, the input device 430 has a touch screen display 435. The input device 430 can include a cursor control, such as a mouse, a trackball, or cursor direction keys, for communicating direction information and command selections to the processor 410 and for controlling cursor movement on the display 435.

According to various embodiments, the processes of assembling and recycling the recyclable thermoplastic unit 100 can be provided by the computing system 400 in response to the processor 410 executing an arrangement of instructions contained in the main memory 415. Such instructions can be read into the main memory 415 from another computer-readable medium, such as the storage device 425. Execution of the arrangement of instructions contained in the main memory 415 causes the computing system 400 to perform the illustrative processes described herein. One or more processors in a multi-processing arrangement may also be employed to execute the instructions contained in the main memory 415. In alternative embodiments, hard-wired circuitry may be used in place of or in combination with software instructions to implement illustrative embodiments. Thus, embodiments are not limited to any specific combination of hardware circuitry and software.

One or more flow diagrams have been used herein. The use of flow diagrams is not meant to be limiting with respect to the order of operations performed. The herein-described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable" to each other to achieve the desired functionality. Specific examples of "operably couplable" include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may not be expressly set forth herein for the sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. An apparatus comprising:
  a casing body composed of a first thermoplastic having a first melting point, wherein the casing body includes a first locking mechanism;
  a sacrifice layer composed of a second thermoplastic having a second melting point, wherein the sacrifice layer attaches to the casing body, wherein the second melting point is greater than the first melting point, wherein the sacrifice layer includes a second locking mechanism configured to mate with the first locking mechanism, and wherein the first locking mechanism and the second locking mechanism are shaped such that the casing body and the sacrifice layer mate by a rotational interaction of the first locking mechanism relative to the second locking mechanism; and a primer layer, wherein the sacrifice layer is located between the primer layer and the casing body.

2. The apparatus of claim 1, further comprising a coating layer, wherein the primer layer is located between the coating layer and the sacrifice layer.

3. The apparatus of claim 1, wherein the first thermoplastic comprises at least one of polyethylene, polypropylene, polyvinyl chloride, or acrylonitrile butadiene styrene.

4. The apparatus of claim 1, wherein the second thermoplastic comprises at least one of polyamide or polybutylene.

5. The apparatus of claim 1, wherein the casing body has a first thickness and the sacrifice layer has a second thickness, and wherein the first thickness is greater than the second thickness.

6. The apparatus of claim 1, wherein the primer layer has the second melting point.

7. The apparatus of claim 1, wherein the primer layer is an adhesive.

8. The apparatus of claim 1, wherein the primer layer is in contact with a surface of the sacrifice layer that is not in contact with the casing body when the sacrifice layer is locked onto the casing body.

9. The apparatus of claim 1, wherein the first locking mechanism comprises a first set of grooves on a surface of the casing body, and further wherein the second locking mechanism comprises a second set of grooves on a surface of the sacrifice layer such that the second set of grooves mates with the first set of grooves.

10. The apparatus of claim 1, wherein the casing body and the sacrifice layer are melted together.

\* \* \* \* \*